United States Patent [19]

Koopman

[11] 4,034,468
[45] July 12, 1977

[54] METHOD FOR MAKING CONDUCTION-COOLED CIRCUIT PACKAGE

[75] Inventor: Nicholas George Koopman, Hopewell Junction, N.Y.

[73] Assignee: IBM Corporation, Armonk, N.Y.

[21] Appl. No.: 720,470

[22] Filed: Sept. 3, 1976

[51] Int. Cl.² .................................. H01R 43/00
[52] U.S. Cl. .............................. 29/628; 29/577; 29/626; 174/16 HS; 174/68.5; 357/81
[58] Field of Search ............ 29/625, 626, 627, 628, 29/630 R, 577; 174/68.5, 52 R, 52 PE, 52 S, 52 H, 16 HS, 17 R, 18, 18 HA; 317/101 CP, 101 DH; 357/81, 82, 83

[56] References Cited
U.S. PATENT DOCUMENTS

| | | | |
|---|---|---|---|
| 3,267,341 | 8/1966 | Evander | 357/81 |
| 3,381,185 | 4/1968 | Whitman et al. | 357/81 |
| 3,429,040 | 2/1969 | Miller | 29/626 |
| 3,430,335 | 3/1969 | Gee | 357/81 |
| 3,675,089 | 7/1972 | Hantusch et al. | 357/81 |
| 3,741,292 | 6/1973 | Aakalu et al. | 357/82 |
| 3,972,062 | 7/1976 | Hopp | 357/68 |
| 3,993,123 | 11/1976 | Chu et al. | 357/82 |

*Primary Examiner*—James R. Duzan
*Attorney, Agent, or Firm*—Thomas F. Galvin

[57] ABSTRACT

A method for making a circuit package which exhibits an excellent heat transfer path from a semiconductor chip or other heat generating device to the heat sink can or cover of the package. A heat conducting pad is placed in proximate relationship to either the heat sink or to a surface of the chip and is metallurgically bonded to the other. In one of the preferred embodiments a low melting point solder, such as indium or an alloy thereof, is metallurgically bonded to the inside of the heat sink cover in a limited central region thereof. The solder is then positioned adjacent the chip and reflowed to substantially fill in the gap between the solder and the chip, but with no stress between the chip and the solder. The assembly exhibits excellent heat transfer from the chip to the cover and any associated heat dissipating structures. The preferred method involves the reflow of a mass of solder against the back side of the chip, which has previously been solder-bonded on the front side to conductors on the surface of an alumina substrate.

19 Claims, 8 Drawing Figures

METHOD FOR MAKING CONDUCTION-COOLED CIRCUIT PACKAGE

CROSS-REFERENCE TO A RELATED APPLICATION

This application is related to co-pending application, Ser. No. 720,471, filed Sept. 3, 1976 in the names of Nicholas G. Koopman and Paul A. Totta, and assigned to the same assignee as the present application.

BACKGROUND OF THE INVENTION

1. Field of the Invention

This invention relates to the packaging of electric circuit devices, such as microminiature integrated circuit chips. In particular, it relates to the dissipation of heat generated by the chips.

2. Description of the Prior Art

The dissipation of heat from a semiconductor chip is a major problem in the industry. As more and more transistors and other devices are fabricated from within the semiconductor chip, the amount of heat which is generated during the electrical operation of the chip increases proportionally.

Semiconductor designers have long been aware of the need for removing the heat and have devised numerous ways to do so. Generally, the techniques can be segregated into two basic means internal to the module: air cooling and liquid cooling. The latter technique usually involves placing the chip packages in a bath of low-boiling-point liquid such as fluorocarbon fluid, for example. This process is very efficient but raises problems with respect to the contamination of the devices by the liquid, leakage of the liquid from the container which could cause catastrophic failure, and increased manufacturing costs.

Air cooling, which generally involves contacting one or more surfaces of the semiconductor chip with a good heat conducting element such as copper, is cheaper, cleaner and unlikely to create problems of the aforementioned catastrophic failures. However, air cooling by simple, direct contact of the heat conductive element to the chip may not conduct sufficient heat away from the chip, due to the imperfect, noncompliant nature of the contact; in addition it imposes stresses within the chip and its interconnecting joints due to the direct transmission of forces caused by thermal expansion and contraction, mechanical disturbances, etc.

Air-cooled assemblies usually involve metallurgically bonding the semiconductor chip to the heat conductive cap, which is also used for sealing the chip. Packages of this type are illustrated, for example, in the articles entitled, "Chip Heat Sink Package Assembly," by Johnson et al, IBM Technical Disclosure Bulletin, March 1970, p. 1665, and "Conduction-Cooled Heat Plate for Modular Circuit Package", Dombrowskas et al, IBM Technical Disclosure Bulletin, July 1970, p. 442. Although effective in removing heat from the chip, such structures involve metallurgical bonds both between the heat sink and the semiconductor chip as well as the heat sink and the conductive sealing cap. Such structures may subject the chip and the chip joints to undue stresses during thermal expansion or contraction.

In addition, reworking capability is particularly important for packages in which a plurality of chips are mounted on a single substrate and enclosed by a single cover. It is often necessary to replace one defective chip out of many or to repair the wiring on the substrate. Bonded connections, however, cannot be disassembled to allow rework or repair.

Other packaging designs have recognized the need to provide both high thermal conductivity as well as the ability to absorb mechanical stress. See, for example, the article entitled, "Conduction-Cooled Chip Module," Dombrowskas et al, IBM Technical Disclosure Bulletin, February 1972, p. 2689. The article suggests the use of pads of conductive dispersion material which never cure or completely harden to fill the space between the chips and the heat sink cover. Such material, however, results in too high a thermal resistance to be practical and may be corrosive.

The above-referenced, related application by Koopman and Totta solves this problem by providing a readily deformable metal or alloy such as indium and mechanically deforming the mass of metal against the back side of the chip after metallurgically bonding the metal to the inside of the cover. This results in a structure which not only provides an excellent heat transfer path from the chip to the cover but also results in little or no stress on the chip or its interconnecting joints during circuit operation. As discussed in the above-identified application, this technique has been very effective in solving this major problem. However, their method requires that the force exerted on the metal pad be carefully controlled so as not to exceed the limits which can be endured by the chip joints or the substrate.

SUMMARY OF THE INVENTION

It is, therefore, a primary object of my invention to improve the cooling of semiconductor chips and other electronic circuit elements such as high-power transistors, resistors, etc.

It is a further object of my invention to provide a method for manufacturing such circuit packages which is easily practiced in modern semiconductor manufacturing lines.

More specifically, it is an object of my invention to provide a method of manufacturing which is most advantageous in the manufacture of chips wherein conductive joints are formed by solder reflow techniques.

It is yet another object of my invention to allow for reworking of semiconductor packages containing a plurality of chips while also providing said good heat conductive paths.

These and other objects and advantages of my invention are achieved by metallurgically bonding a low-melting-point solder such as indium to a surface of either the heat sink cover or the chip, positioning the pad adjacent to the other surface and then reflowing the solder into proximate, but unbonded, relationship to the other surface. The lack of a metallurgical bond at one or the other of the cover-solder or chip-solder interfaces. This minimizes the stress between the chip and its interconnecting joints and the cover; in addition, it allows for the separation of the cover from the chip during a rework operation.

My invention is particularly advantageous for "flip-chip" packages in which the electrical connections from the active devices within the chip to the conductive lands on the supporting substrate comprises solder contact joints from the front-side surface of the chip, as described in U.S. Pat. No. 3,429,040, issued in the name of L. F. Miller and assigned to the same assignee as the present application.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1A:
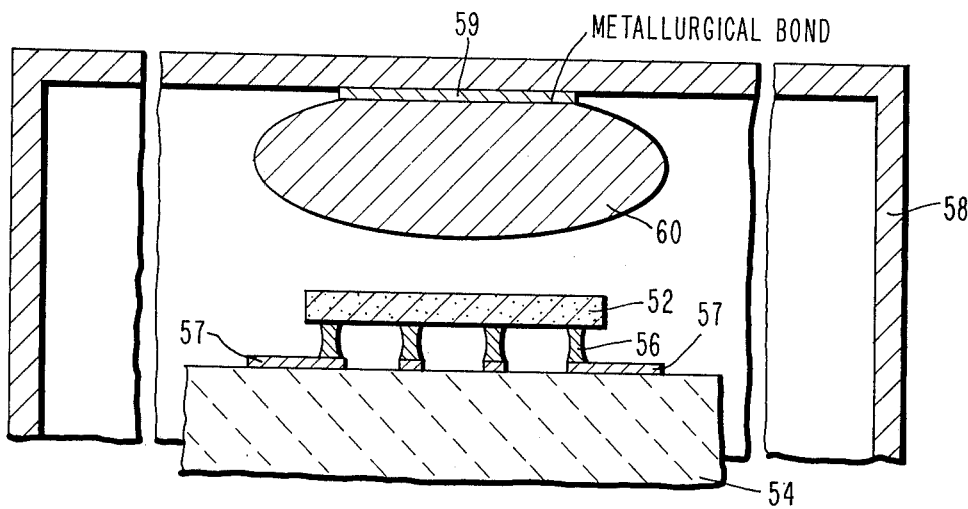
FIGS. 1A and 1B are cross-sectional views of a chip package showing how a pad which is bonded to a heat-sink cover is reflowed into proximate relationship to the chip surface. Reflow, melt and liquify will be used interchangeably throughout the specification.
Figure 1B:
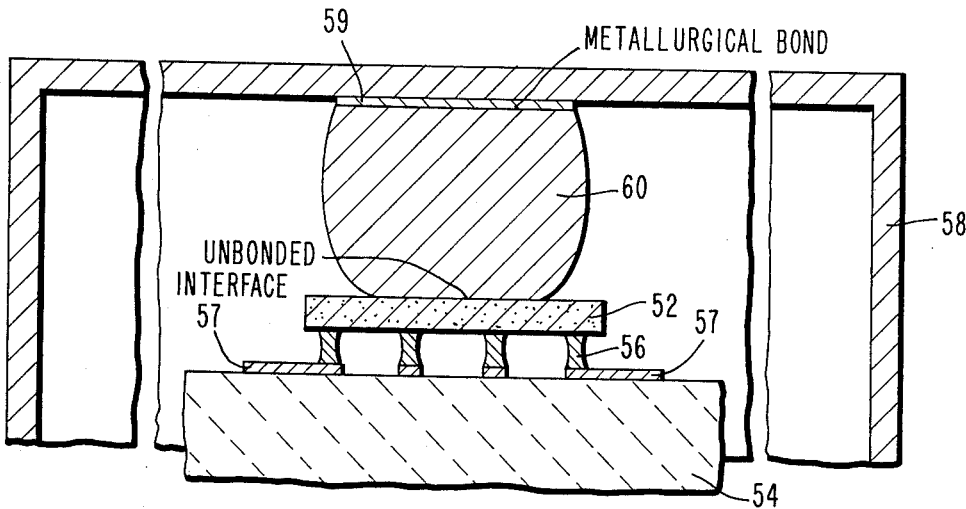

Referring now to FIGS. 1A, and 1B, the circuit package comprises a semiconductor chip 52 mounted on substrate 54, which is typically a ceramic such as alumina. Conductive lands 57 are disposed on ceramic 54 and are connected to chip 52 by solder contacts 56. A heat-conductive cap 58 encloses chip 52 in cooperation with substrate 54. Conductive pins (not shown), are provided through substrate 54 to electrically interconnect lands 57 with an external printed circuit board (not shown). Although my invention is advantageously concerned with semiconductor chips containing many thousands of circuit elements, other heat-generating electric or electronic devices such as high power transistors, resistors, etc., could be heat-sinked in accordance with my invention.

What has been described thus far is well known to those of skill in the semiconductor packaging art and forms no part of my invention. Such a structure follows the teachings contained in U.S. Pat. No. 3,429,040 which was previously cited. My invention involves the method of providing thermal pad 60 between chip 52 and the interior of cap 58. Most importantly, the method provides a metallurgical bond at one interface between pad 60 and either cap 58 or chip 52 and a non-metallurgical bond comprising an infinitesimal gap at the other interface.

In FIG. 1A, pad 60 is metallurgically bonded to cap 58 by means of a thin film 59. For example, if cap 58 were aluminum, film 59 could be copper evaporated thereon to form a metallurgical bond. Pad 60, which is preferably indium, is then reflowed to the copper 59, thereby forming a metallurgical bond between indium 60 and cap 58. Other films 59 which could be used are copper, nickel, gold and Cr-Cu-Au, among others.

Alternatively, cap 58 could be copper or brass, to which indium 60 makes a metallurgical bond without the necessity of a solderable interface metal 59. However, to constrain solder 60 to a well-defined location on cap 58 over chip 52 it would be necessary to provide a non-solderable stop-off such as chromium surrounding the central site to prevent the solder from flowing over the entire inner surface of cap 58. In practice, the chromium is evaporated on the interior of cap 58. An opening is milled or etched in the chromium at the central location under which the chip will be disposed, and the indium is reflowed to the brass or copper area surrounded by the chromium stop-off.

After having deposited indium solder 60 onto the cap, it is advantageous to deform or "coin" the indium to provide the slightly rounded lower surface 51 shown in FIG. 1A. The formation of this camber is easily accomplished with indium because it is quite soft. Specifically, the cambering is accomplished by pressing a rod with a concave surface onto the surface of the indium. Liquid phase shaping may be necessary for solders which are harder than indium, e.g., Pb-Sn eutectic.

The solder is then placed adjacent the upper surface of chip 52 as shown in FIG. 1A. In practice, the distance between them is usually around 1 – 20 mils.

After indium solder 60 is reflowed at about 160° C, the structure shown in FIG. 1B results. It tends to "ballup" proximately against chip 52 as shown by surface tension and its own weight; however, it does not bond with the chip. Instead, there is a small gap, estimated to be around one micron or less by capacitance measurements, at the unbonded interface between solder 60 and chip 52. The final gap size is a function of manufacturing tolerances and the thermal expansion coefficients of the various materials which comprise the package. The unbonded interface is similar to a "cold" solder joint. The existence of a small gap of this nature serves to reduce the stress encountered by both chip 52 as well as solder joints 56 when the package is operating in its environment. In addition, the package can easily be separated at the interface. Because of the metallurgical bond at the cap, the solder remains engaged with cap 58 when the package is separated.

Besides pure indium, I have also used lead-tin eutectic and pure tin for the pad. In addition, there are many other low temperature solders which could be used.

To decrease the thermal resistance between chip 52 and cap 58 even further, the package could be filled with helium gas, which exhibits a thermal conductivity which is six times higher than air and is inert. The helium would fill in the small gap at the unbonded interface. However, helium tends to leak from the package and means must be provided to maintain a constant pressure of helium in the module for its lifetime. For single chip modules the cost may be prohibitive.

Alternatively, the upper surface of chip 52 may be lightly coated with silicone oil to act as a heat conducting medium in the unbonded interface. I prefer to first assemble the package as shown in FIGS. 1A and 1B without applying the oil. This ensures that the lower surface of solder 60 conforms well to the upper major surface of chip 52. I then separate the package at the unbonded interface, apply a thin coating of silicone to the chip surface and reassemble the package. The chip remains in proximate relationship with the solder after reassembly.

This process, too, has its drawbacks. The oil must be of the highest purity lest it contaminate the chip. In addition, the extra fabrication steps described above are required.

It may be necessary to provide electrical isolation between the circuits within chip 52 and cap 58. There are numerous options to ensure this which will occur to those of skill in the semiconductor packaging art. For example, a thin film insulator could be provided between the inner surface of cap 58 and thin film 59. Alternatively, a thin film insulator such as silicon dioxide, silicon nitride, etc. could be provided on the upper surface of chip 52 prior to joining pad 60 to chip 52. In the case of a silicon semiconductor chip, silicon dioxide usually occurs as part of the chip as a natural consequence of device fabrication. Other techniques will be discussed below with respect to other figures in the drawing.

The use of pure indium as solder pad 60 is most advantageous in a package wherein chip 52 is joined to conductive lands 57 on substrate 54 by solder pads 56. Pads 56 are typically composed of alloys of lead/tin or lead/indium. Pure indium has a lower melting point than those alloys; and the reflow of indium solder 60 has no effect on the integrity of pads 56. Even if a solder with a higher melting point than the melting point of pads 56 were used, however, the solder pads would still tend to maintain their position between the metallization at the back side of chip 52 and lands 57. Using a pad 60 with a lower melting point than joints 56 is more desirable.

Even though my technique is preferably applied to solder-bonded joints, it is also applicable to other conventional joining methods such as where leads are thermocompression bonded or ultrasonically bonded between the chip and the conductive lands.

Figure 2:
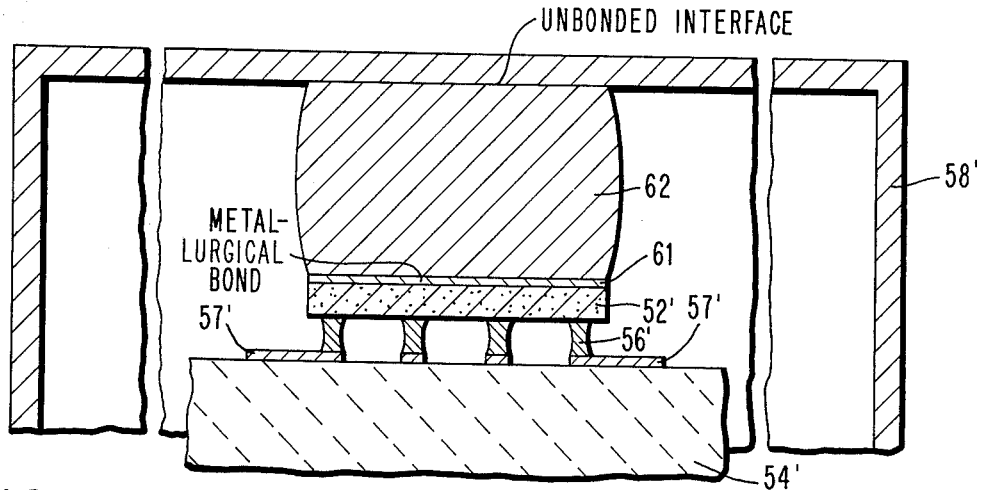
FIG. 2 is a cross-sectional view of a chip package wherein the pad is bonded to the chip and reflowed into proximate relationship to the heat sink cover.

Turning now to FIG. 2, there is shown a module in which the unbonded interface lies between solder pad 62 and metal cap 58', and the metallurgical bond is made by means of thin film 61 between pad 62 and chip 52'. Typically, film 61 is Cr-Cu-Au composite which adheres well to silicon, silicon dioxide and silicon nitride. Other suitable thin films are Cr-Ni, Ti-Pd-Au or Cr-Cu which provide a solderable surface for indium, tin, lead-tin eutectic, etc.

The process for fabricating the package in FIG. 2 corresponds in many details and preferred materials with that described in FIGS. 1A and 1B. Most advantageously, thin film 61 is evaporated on the upper major surface of chip 52'. Indium solder pad 62 is deposited on top of film 61 and reflowed to form the metallurgical bond. After the pad has hardened, the substrate, chip and solder are brought into engagement with package 58'. Pad 62 is again reflowed into engagement therewith to form the unbonded interface. To ensure proper engagement at the unbonded interface, the package is rotated prior to reflow so that cap 58' is disposed beneath pad 62. Although the process is somewhat more difficult to accomplish, the advantages of a metallurgically bonded interface at one surface of pad 62 and an unbonded interface at the other surface are achieved.

Figure 3A:
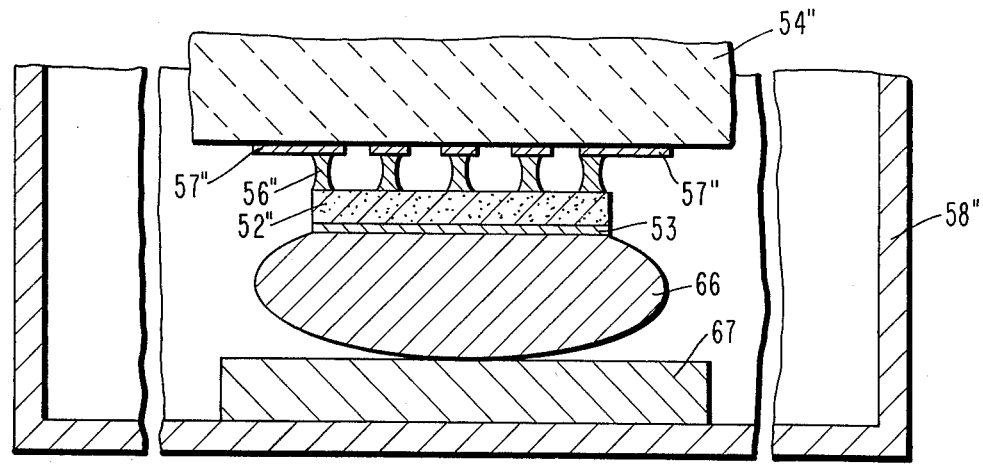
FIGS. 3A and 3B are cross-sectional views of a chip package showing how two separate solder pads, one of which is metallurgically bonded to the chip and the other of which is placed on the heat sink cover may be joined by a solder reflow technique to form a large area mass of solder.
Figure 3B:
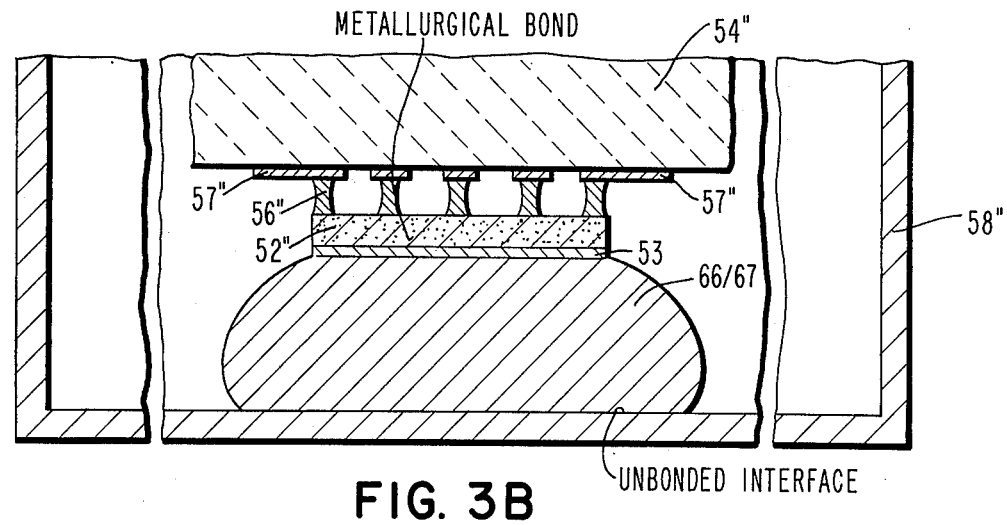

FIGS. 3A and 3B show the process for forming a two-component pad which comprises alloying two solders, 66 and 67. Such a technique provides a much larger area of pad material at an interface than is feasible with the previously-described single component.

Typically, pad 66 is indium and pad 67 is tin which, when heated at greater than 117° C, forms a tin-indium eutectic.

In the process, indium pad 66 is metallurgically bonded to chip 52'' by means of thin film 53 substantially as described above with respect to FIG. 2. Tin solder 67 is deposited on a central region of cap 58''', which may be aluminum or another metal to which tin will not solder.

After these steps are accomplished the module is aligned as shown in FIG. 3A, with the back side of chip 52'' facing down and with solder 66 disposed adjacent to solder 67. Pressure is applied to force solder 66 into engagement with solder 67, as by applying downward pressure on substrate 54''. The module is then heated to greater than 117° C, the eutectic temperature of the tin-indium alloy 66/67 as shown in FIG. 3B.

The above example has utilized the solid state diffusion of indium and tin to form a liquid indium/tin eutectic. Other embodiments are possible; for example, both pads 66 and 67 could be the same element, such as indium. In this case the melting point of indium, 160° C, must be exceeded to make the conformal connection.

Figure 4:
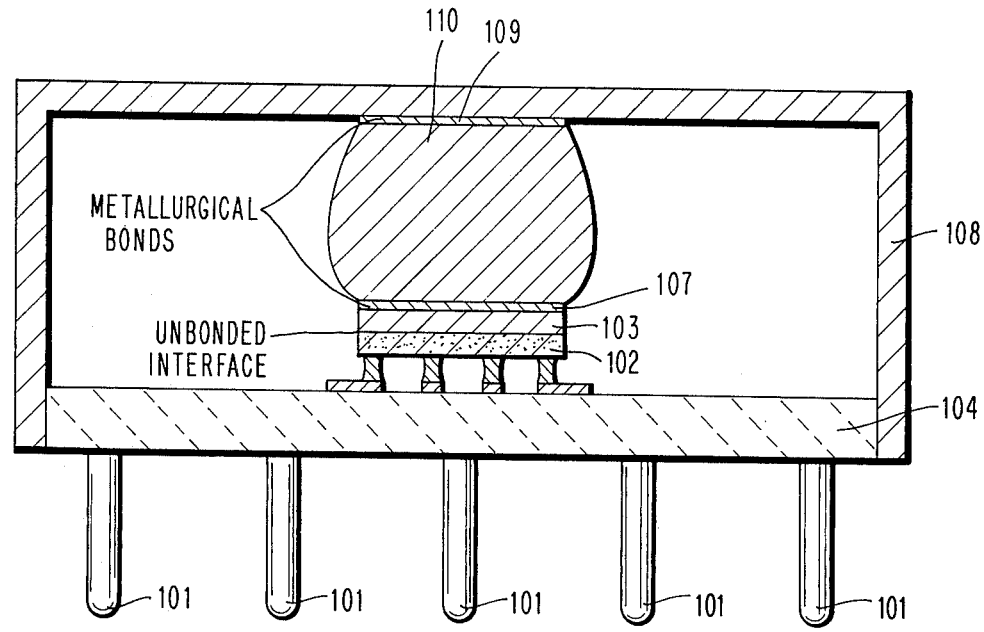
FIG. 4 is a cross-sectional view of a chip package wherein a "dummy" chip is used between the pad and an operative, heat-generating semiconductor chip.

In the embodiment shown in FIG. 4, a "dummy" chip 103 is disposed between pad 110 and the active chip 102. The principal purpose of the "dummy" chip is to achieve a complete area match between chip 102 and the heat conducting pad. Thus, chip 103 may have a larger surface area than chip 102 to compensate for any alignment errors and ensure complete coverage of chip 102. The "dummy" chip could also provide electrical isolation to prevent chip-to-heat sink cover or, in multi-chip modules, chip-to-chip shorting without thermal degradation of the heat conducting path.

The "dummy" chip is advantageously comprised of silicon having a coating such as silicon dioxide or silicon nitride disposed on the surface, anodized aluminum or beryllium oxide. This last material has the advantages of being both a good electrical insulator as well as having high thermal conductivity. However, it is also quite poisonous in its powdered state prior to molding and, on the whole, an insulated silicon chip is more useful in the manufacturing environment. The "dummy" chip 103 could also be a metal such as copper.

As illustrated in FIG. 4, solder pad 110 is metallurgically bonded both to a cap 108 by means of thin film 109 as well as the "dummy" chip 103 by means of thin film 107. The interface between chips 102 and 103 is unbonded and as contiguous as possible. Pins 101 are connected to the lands on substrate 104.

Figure 5:
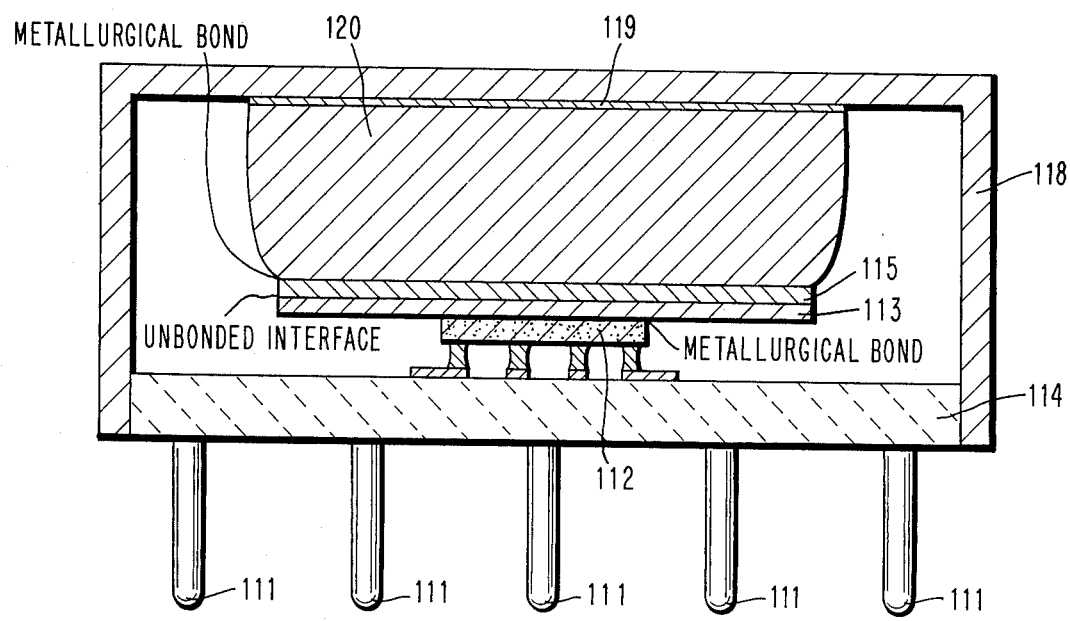
FIG. 5 is a cross-sectional view of a chip package which features the use of an extended "dummy" chip to allow for a larger pad between the operative chip and the heat sink cover.

In FIG. 5, the concept of the "dummy" chip is utilized to increase the volume of solder pad 120 available to cool chip 112. Besides "dummy" chip 115, the package includes an extended chip 113 which is metallurgically bonded to the functioning chip 112. As in the embodiment in FIG. 4, "dummy" chip 115 is metallurgically bonded by means of thin film 119 to cap 118 and pad 120, and in proximate relationship with, but unbonded to, chip 113 which is carried on substrate 114 formed with connector pins 111.

The use of an extended "dummy" chip 115 also leads to the possibility of substituting an array of numerous solder pads for the single solder pad 120. These may be desirable to avoid problems associated with reflowing a large mass of solder 120. They would create no problem with respect to heat dissipation because the thermal resistance across the solder is usually low as compared to that across the unbonded interface. Multiple solder pads could be used if chip 112 were very large, e.g., one-half inch square without the need for an extended chip.

The use of an extended chip also provides an excellent means for cooling other types of components, the surfaces of which are not planar. If the component were cylindrical, for example, chip 113 in FIG. 5 could be fabricated having a cylindrical surface to match the shape of the cylindrical component and another surface which is planar. The flat surface of the extended chip would then be in proximity, but metallurgically unbonded, to the solder pad. In this way, almost any type of component, whatever its geometrical configuration, could be cooled by my method without problems of solder flowing off the surface of the device to be cooled or of surfaces on the device which are not in proximate relationship with the solder pad.

Figure 6:
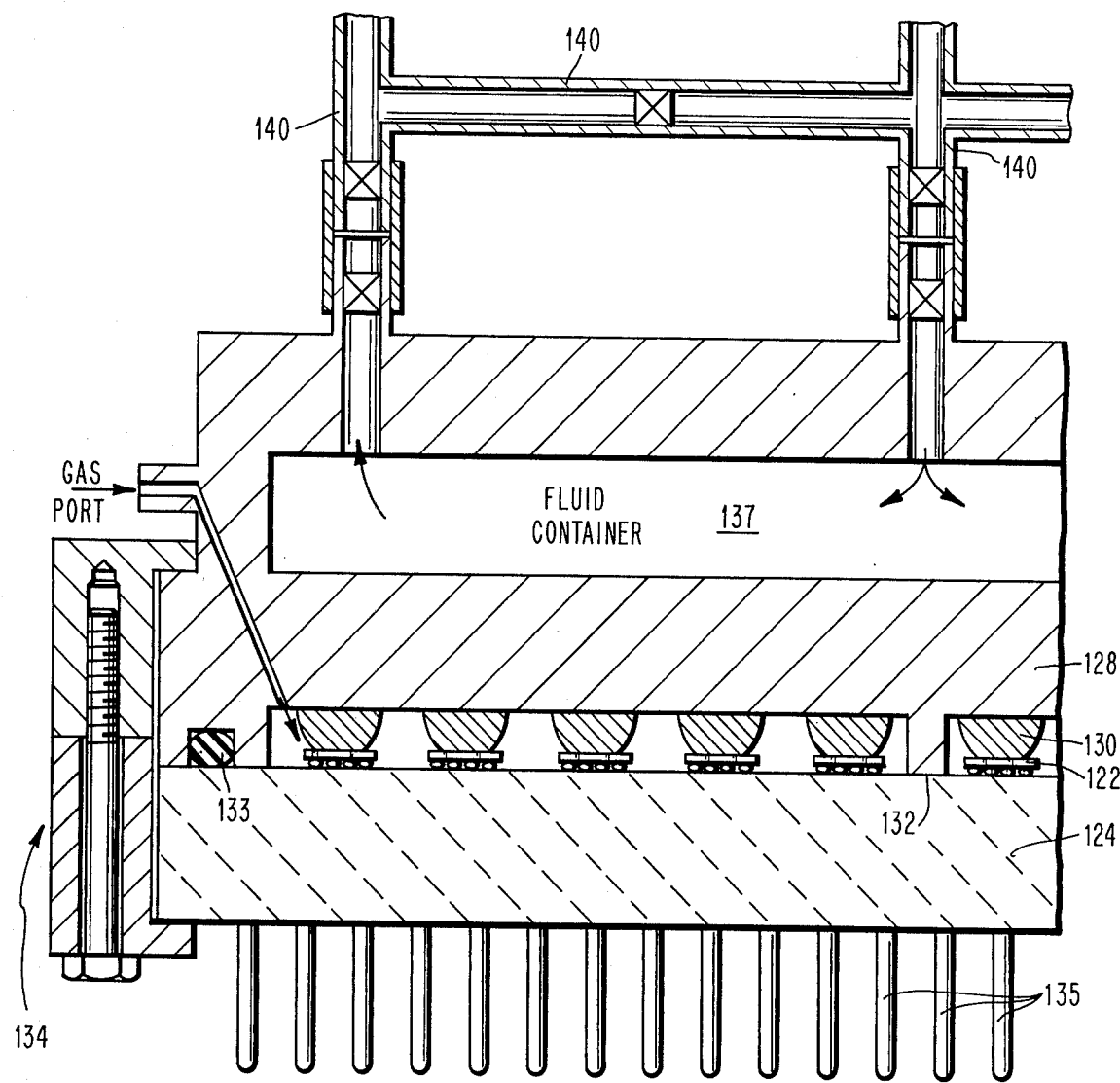
FIG. 6 is a cross-sectional view of a multi-chip module in which each chip has a separate heat sink pad in accordance with my invention.

FIG. 6 illustrates a multi-chip module which embodies my method. Such modules, usually containing up to one hundred or more semiconductor integrated circuit chips have been proposed in the past but none has been commercially successful to my knowledge. Ordinarily, they are cooled by liquid within the chamber containing the chips and this has resulted in the problems previously discussed in Background of the Invention section of the specification.

In the package, each chip 122 is thermally connected to heat-sink cover 128 by solder pads 130. Any of the previously described embodiments involving the formation of metallurgically bonded interface and an unbonded interface is applicable. Advantageously, cap 128 is aluminum. It could also be fabricated from molybdenum or beryllia which have low thermal expansion coefficients to match alumina substrate 124. In practice, Mo and BeO are difficult to machine.

Standoffs 132 are provided as positive stops to avoid inordinate pressure on any chip from cap 128.

Returning to FIG. 6, the cap is sealed to substrate 124, formed with connector pins 135, by means of an O-ring 133 and the locking mechanism 134 which comprises a pair of engaging plates which are bolted together. A gas port is provided through cap 128 to allow for the entry of a gas such as helium which increases the heat dissipation of the system, as previously discussed.

Cap 128 is machined to provide a chamber 137 for external fluid cooling. The fluid could be water, Freon or any other known cooling fluid, which flows through the upper surface of the cap by means of plumbing connections 140 to an external cooling system not shown.

Numerous other types of packages may be devised to incorporate my invention. The system in FIG. 6 is illustrated only to indicate how such a system would effectively utilize my invention. One of the principal advantages of such a package is that a defective component may be replaced or repaired after assembling because the entire package can be separated at the unbonded interface which is located either at the pad cap interface or the pad chip interface. Upon repair, the package is reassembled and the pads reshaped by solder reflow.

Another advantage lies in the option of using chips which have different heat-generating properties in the same package. The pads can be tailored to ensure that each chip operates at the same temperature. Moreover, the cap 128 could contain pedestals or recesses for the heat-sink pads to accommodate different types of components.

In summary, I have invented a method for providing a good thermal conduction path from the heat-generating electric device to the heat sink which does not impose mechanical stresses which endanger the integrity of the device or its joints.

The basic invention is susceptible to numerous modifications and improvements which depend on design factors associated with a particular system. Numerous such modifications have been discussed with respect to particular figures of the drawing.

Thus, while the invention has been particularly shown and described with reference to preferred embodiments thereof, they will be understood by those skilled in the art that various changes in form and the details may be made therein without departing from the spirit and scope of the invention.

I claim:

1. In the method of fabricating a circuit package in which a heat-generating component is cooled by conduction of heat to a heat sink component, the improvement comprising:
    metallurgically bonding a pad of solder to a major surface of either one or the other of said components;
    positioning said solder pad adjacent to a major surface of the other of said components; and
    heating said solder pad to a temperature and for a time sufficient to melt said solder pad to bring said solder pad into proximate, unbonded relationship with said major surface of said other component.

2. A method as in claim 1 wherein said heatgenerating element is a semiconductor chip.

3. A method as in claim 2 wherein said chip is electrically connected to a substrate by means of solder joints which are disposed on the surface of said chip which is opposite said major surface of said chip.

4. In the method of fabricating a circuit package in which a semiconductor chip is cooled by a heat-sink cover, the improvement comprising:
    metallurgically bonding a pad of solder to a central region of said heat-sink cover;
    positioning said pad adjacent to a major surface of said chip; and
    heating said solder pad to a temperature and for a time sufficient to melt said solder pad to bring said solder pad into proximate, unbonded relationship with said major surface of said chip.

5. A method as in claim 4 wherein said heat-sink cover is a material to which said solder pad does not make a metallurgical bond and wherein said bonding step comprises:
    depositing a metal to which said solder pad forms a metallurgical bond on said heat sink; and
    reflowing said solder to said metal.

6. A method as in claim 5 wherein said material is aluminum and said metal is selected from the group consisting of copper, nickel, gold and chromium-copper-gold.

7. A method as in claim 4 wherein said heat-sink cover is a material to which said solder pad makes a metallurgical bond and wherein said bonding step includes the step of:
    prior to bonding said solder pad, depositing a material to which said solder does not form a metallurgical bond around said central region of said heat sink.

8. A method as in claim 7 wherein said heat sink is selected from the group consisting of copper and brass and said material is chromium.

9. A method as in claim 4 further comprising the steps of:
  separating said package at the interface of said solder pad and said chip;
  applying a thermally conductive fluid to at least one of said interface surfaces; and
  reassembling said package.

10. In the method of fabricating a circuit package in which a semiconductor chip is cooled by a heat sink, the improvement comprising:
  metallurgically bonding a pad of solder to a major surface of said chip;
  positioning said pad adjacent to a major surface of said heat sink; and
  heating said solder to a temperature and for a time sufficient to liquify said solder to bring said solder into proximate, unbonded relationship with said major surface of said heat sink.

11. A method as in claim 10 wherein said chip surface is a material to which said solder pad does not make a metallurgical bond and wherein said bonding step comprises:
  depositing a metal to which said solder pad forms a metallurgical bond on a said chip surface; and
  reflowing said solder to said metal.

12. A method as in claim 10 further comprising the steps of:
  prior to said positioning step, depositing another pad of solder on said heat sink, whereby said pads of solder form an alloy with each other after said heating step.

13. In the method of fabricating a circuit package in which a semiconductor chip is cooled by a heat sink, the improvement comprising:
  metallurgically bonding a pad of solder to a central region of said heat sink;
  providing a component which has a major surface conforming to a major surface of said chip;
  metallurgically bonding another surface of said component to said solder pad;
  positioning said major surface of said component adjacent to said major surface of said chip; and
  heating said solder to a temperature and for a time sufficient to liquify said solder to bring said major surface of said component into proximate relationship with said major surface of said chip.

14. A method as in claim 13 wherein said component is a chip having substantially at least the same major surface area as said semiconductor chip.

15. A method as in claim 13 wherein said component is selected from the group consisting of oxidized silicon, beryllium oxide and anodized aluminum.

16. In the method of fabricating a circuit package in which a semiconductor chip is cooled by a heat sink, the improvement comprising:
  metallurgically bonding a pad of solder to a central region of said heat sink;
  providing first and second components which have major surfaces conforming to each other;
  metallurgically bonding other surfaces of said first and second components to said solder pad and said chip, respectively;
  positioning said major surface of said components adjacent each other; and
  heating said solder to a temperature and for a time sufficient to liquify said solder to bring said major surfaces of said components into proximate, unbonded relationship with each other.

17. A method as in claim 16 wherein said components have substantially at least the same major surface area as said semiconductor chip.

18. In the method of fabricating a circuit package in which a plurality of heat-generating components are cooled by conduction of heat to a heat sink, the improvement comprising:
  metallurgically bonding a plurality of solder pads to respective major surfaces of said heat-generating components;
  positioning said solder pads adjacent to said heat sink; and
  heating said solder pads to a temperature and for a time sufficient to liquify said solder pads to bring said solder pads into proximate, unbonded relationship with said heat sink.

19. In the method of fabricating a circuit package in which a plurality of heat-generating components are cooled by conduction of heat to a heat sink, the improvement comprising:
  metallurgically bonding a plurality of solder pads to said heat sink;
  positioning said solder pads adjacent to respective ones of said heat-generating components; and
  heating said solder pads to a temperature and for a time sufficient to liquify said solder pads to bring said solder pads into proximate, unbonded relationship with said respective heat-generating components.

* * * * *